(12) United States Patent
Kubota et al.

(10) Patent No.: US 7,221,208 B2
(45) Date of Patent: May 22, 2007

(54) SWITCHING CIRCUIT

(75) Inventors: Kenichi Kubota, Saitama (JP); Masaki Ohshima, Saitama (JP); Yukihiro Nozaki, Saitama (JP); Hiroyuki Haga, Saitama (JP); Masanori Hayashi, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/541,385

(22) PCT Filed: Jan. 7, 2004

(86) PCT No.: PCT/JP2004/000029

§ 371 (c)(1),
(2), (4) Date: Jul. 1, 2005

(87) PCT Pub. No.: WO2004/068709

PCT Pub. Date: Aug. 12, 2004

(65) Prior Publication Data

US 2006/0049810 A1    Mar. 9, 2006

(30) Foreign Application Priority Data

Jan. 16, 2003    (JP)    ............................. 2003-007728

(51) Int. Cl.
*H03K 17/687*    (2006.01)
(52) U.S. Cl. .................. 327/427; 327/541; 323/312
(58) Field of Classification Search ................ 327/427, 327/538–541; 323/312, 315
See application file for complete search history.

(56) References Cited

U.S. PATENT DOCUMENTS 5,361,008 A * 11/1994 Saijo .......................... 327/427

(Continued)

FOREIGN PATENT DOCUMENTS

EP    0890844 A2    1/1999

(Continued)

OTHER PUBLICATIONS

Supplementary European Search Report dated Mar. 7, 2006.

(Continued)

*Primary Examiner*—Dinh T. Le
(74) *Attorney, Agent, or Firm*—Rader, Fishman & Grauer PLLC; Toshikatsu Imaizumi

(57) ABSTRACT

The present invention provides a switching circuit comprising a current detecting circuit that detects current waveform of a main switch in real time waveform and outputs it in low impedance. The switching circuit comprises the current detecting circuit having the main switch (11), of which on-voltage shows resistance characteristics, wherein a gate terminal is connected to a driving circuit (4) and further either terminal of drain or source thereof is connected to a fixed potential (3) and the other terminal thereof is connected to a load circuit (2) respectively, a first resistance element (21), of which resistance value is higher than on-resistance of the main switch connected to the fixed potential (3), a subsidiary switch (12), a source terminal thereof is connected to the first resistance element (21), an amplifier (6) that amplifies comparatively voltage generated in the first resistance element (21) and outputs to a gate terminal of the subsidiary switch (12) and the second resistance element (22) that generates voltage by amplifying on-current of the main switch (11) by connecting to the drain terminal of the subsidiary switch (11).

6 Claims, 11 Drawing Sheets

U.S. PATENT DOCUMENTS

| | | | | |
|---|---|---|---|---|
| 5,986,441 | A | * | 11/1999 | Koroncai et al. ............ 323/277 |
| 6,229,355 | B1 | | 5/2001 | Ogasawara |
| 6,424,131 | B1 | | 7/2002 | Yamamoto et al. |
| 6,737,856 | B2 | * | 5/2004 | Sander .................... 324/158.1 |
| 2006/0028192 | A1 | * | 2/2006 | Ryu et al. ................... 323/312 |

FOREIGN PATENT DOCUMENTS

| | | |
|---|---|---|
| JP | 01-026250 B2 | 5/1989 |
| JP | 04-134271 A | 5/1992 |
| JP | 07-113826 A | 5/1995 |
| JP | 09-145749 A | 6/1997 |
| JP | 2000-235424 A | 8/2000 |
| JP | 2000-299626 A | 10/2000 |
| JP | 3152000 B2 | 1/2001 |
| JP | 2001-267898 A | 9/2001 |
| JP | 2001-267899 A | 9/2001 |
| JP | 2002-353794 A | 12/2002 |
| WO | 00/79682 A1 | 12/2000 |
| WO | WO-2004/068709 A1 | 8/2004 |

OTHER PUBLICATIONS

International Search Report for PCT/JP2004/000029 mailed on Feb. 24, 2004.
English translation of International Search Report for PCT/JP2004/000029 mailed on Feb. 24, 2004.
International Preliminary Report for PCT/JP2004/000029 completed on Apr. 5, 2005.
Office Action mailed on Dec. 13, 2006 (Japan).
Partial Translation of the JPO Office Action.

* cited by examiner

SWITCHING CIRCUIT

FIELD OF THE INVENTION

The present invention relates to a circuit for detecting current of a switch by detecting on-voltage of a power switch.

RELATED ART

A first conventional example of a switching circuit having a current detecting circuit is shown in FIG. 10. This conventional example is equipped with a main switch 111 composed of MOSFET, of which on-voltage shows resistance characteristics, and a gate terminal of the main switch 111 is connected to a driving circuit 104. And a drain terminal of the main switch 111 is connected to a fixed potential 103, and a source terminal thereof is connected to a load circuit 102. A current detecting circuit installed in the switching circuit has a current detecting switch 114 wherein a drain terminal thereof is connected to the fixed potential and a gate terminal thereof is connected to the driving circuit 104. Further, a source terminal of the current detecting switch 114 is connected to a resistance element 121 and a positive-terminal of an amplifier 106 and the source terminal of the main switch 111 is connected to a negative-terminal of the amplifier 106, which is constructed so that current can be detected by amplifying voltage of a resistance element 121.

And a second conventional example is shown in FIG. 11, which is described based on Japanese Patent No. H1-26250. This conventional example comprises the main switch 111 composed of MOSFET, of which on-voltage shows resistance characteristics, the gate terminal thereof is connected to the driving circuit 104. And the drain terminal of the main switch 111 is connected to the fixed potential 103 and its source terminal is connected to the load circuit 102. The current detecting circuit installed in this switching circuit comprises the current detecting switch 114, whose drain terminal is connected to the fixed potential and whose gate terminal is connected to the driving circuit 104. And further by applying a standard current to the current detecting switch 114, on-voltage of the current detecting switch 114 and on-voltage of the main switch 111 are to be amplified comparatively by the amplifier 106.

At first, in the first conventional example, in order that current of the resistance element 121 is proportional to on-current of the main switch 111, voltage of the resistance element 121 must be half of the on-voltage of the current detecting switch 114 or less. Therefore, in order to amplify waveform up to the level usable for a control circuit, an amplifier needs to have high gain capacity. Because current waveform includes components of high frequency, it was actually difficult to amplify the current wave up to high frequency keeping a high gain capacity.

And in the second conventional example, because by applying a standard current to the current detecting switch 114, on-voltage of the current detecting switch 114 and on-voltage of the main switch 111 is to be amplified comparatively, it has been a problem that an output signal is not real time current waveforms so that results of comparison are above or below a defined current level.

DISCLOSURE OF THE INVENTION

In view of the above problem, the present invention is to provide a switching circuit with a low cost having a current detecting circuit that detects current waveform of the main switch in form of a real time waveform in high speed and outputs it in form of a large signal with low impedance.

In the present invention, the above-described object is achieved by providing the current detecting circuit that can output large current waveform while keeping difference of input voltage of an amplifier to be about zero volt. And by connecting the third switch, of which gate signal synchronizes that of the main switch, between a first resistance element and a subsidiary switch, voltage waveform of the second resistance element becomes similar to that of current waveform of the main switch, so that the current waveform with a high speed can be treated as a large voltage signal.

When the first resistance element made from poly-silicon resistance is formed on an insulating film, insulation between the main switch and the first resistance element can be formed easily and a highly integrated circuit may be possible and parasitic capacity etc. becomes small so that high speed operation becomes possible. When the first resistance element is formed so as to have its temperature coefficient with higher positive value than that of the main switch, in the current detecting circuit using the first resistance element, it is possible to easily provide a switching circuit with stronger function of anti-heat-bursting. Therefore, a current detecting circuit with many excellent features can be easily formed.

That is, to solve the above-described problems, the present invention has structures set forth below.

According to a first embodiment of the present invention, a switching circuit having a switching element, comprises a current detecting circuit having a main switch composed of MOSFET, whose on-voltage shows resistance characteristics, wherein a gate terminal thereof is connected to a driving circuit, and further one of a drain terminal and a source terminal thereof is connected to a fixed potential and the other terminal is connected a load circuit, a first resistance element having higher resistance value than on-resistance of the main switch, a subsidiary switch composed of MOSFET, the source terminal of which is connected to the first resistance element, an amplifier that amplifies comparatively voltage generated in the first resistance element and on-voltage of the main switch and outputs it to a gate terminal of the subsidiary switch, and a second resistance element that generates voltage by amplifying on-current of the main switch by connecting to a drain terminal of the subsidiary switch.

According to a second embodiment of the present invention, in the switching circuit according to the first embodiment of the present invention, one of terminals of the first resistance element is further connected to a fixed potential as in the main switch.

According to a third embodiment of the present invention, in the switching circuit according to the first embodiment of the present invention, a third switch, whose gate signal synchronizes that of the main switch, is connected between the first resistance element and the subsidiary switch.

According to a fourth embodiment of the present invention, in the switching circuit according to the first embodiment of the present invention, one of terminals of the first resistance element is connected to a fixed potential as in the main switch and the third switch, whose gate signal synchronizes that of the main switch is connected between the first resistance element and the subsidiary switch.

According to a fifth embodiment of the present invention, in the switching circuit according to the first embodiment of the present invention, one of terminals of the first resistance element is connected to a terminal which is connected to a load circuit of the main switch, and the other terminal of the first resistance element is connected to the source terminal of the subsidiary switch.

According to a sixth embodiment of the present invention, in the switching circuit according to the first embodiment of the present invention, the first resistance element has the same cell structure as the main switch and is MOSFET biased by a fixed gate or poly-silicon resistance.

According to a seventh embodiment of the present invention, in the switching circuit according to the first embodiment of the present invention, the first resistance element has the same cell structure as the main switch and is MOSFET biased by fixed gate or poly-silicon resistance, wherein one of terminals of the first resistance element is connected to a fixed potential as in the main switch.

According to an eighth embodiment of the present invention, in the switching circuit according to the first embodiment of the present invention, the first resistance element has the same cell structure as the main switch and is MOSFET biased by a fixed gate or poly-silicon resistance wherein the third switch, whose gate signal synchronizes that of the main switch, is connected between this first resistance element and the subsidiary switch.

According to a ninth embodiment of the present invention, in the switching circuit according to the first embodiment of the present invention, the first resistance element has the same cell structure as the main switch and is MOSFET biased by a fixed gate or poly-silicon resistance, wherein one of terminals of the first resistance element is connected to a fixed potential as in the main switch and the third switch, of which gate signal synchronizes that of the main switch, is connected between this first resistance element and the subsidiary switch.

According to a tenth embodiment of the present invention, in the switching circuit according to the first embodiment of the present invention, the first resistance element has the same cell structure as the main switch and is MOSFET biased by the fixed gate or poly-silicon resistance wherein one of terminals of this first resistance element is connected to a terminal which is connected to the load circuit of the main switch and the other terminal of the first resistance element is connected to the source terminal of the subsidiary switch.

DETAILED DESCRIPTION OF THE PREFERRED EMBODIMENTS

Embodiments of a switching circuit according to the present invention will be described hereafter with reference to attached figures.

Embodiment 1

Figure 1:
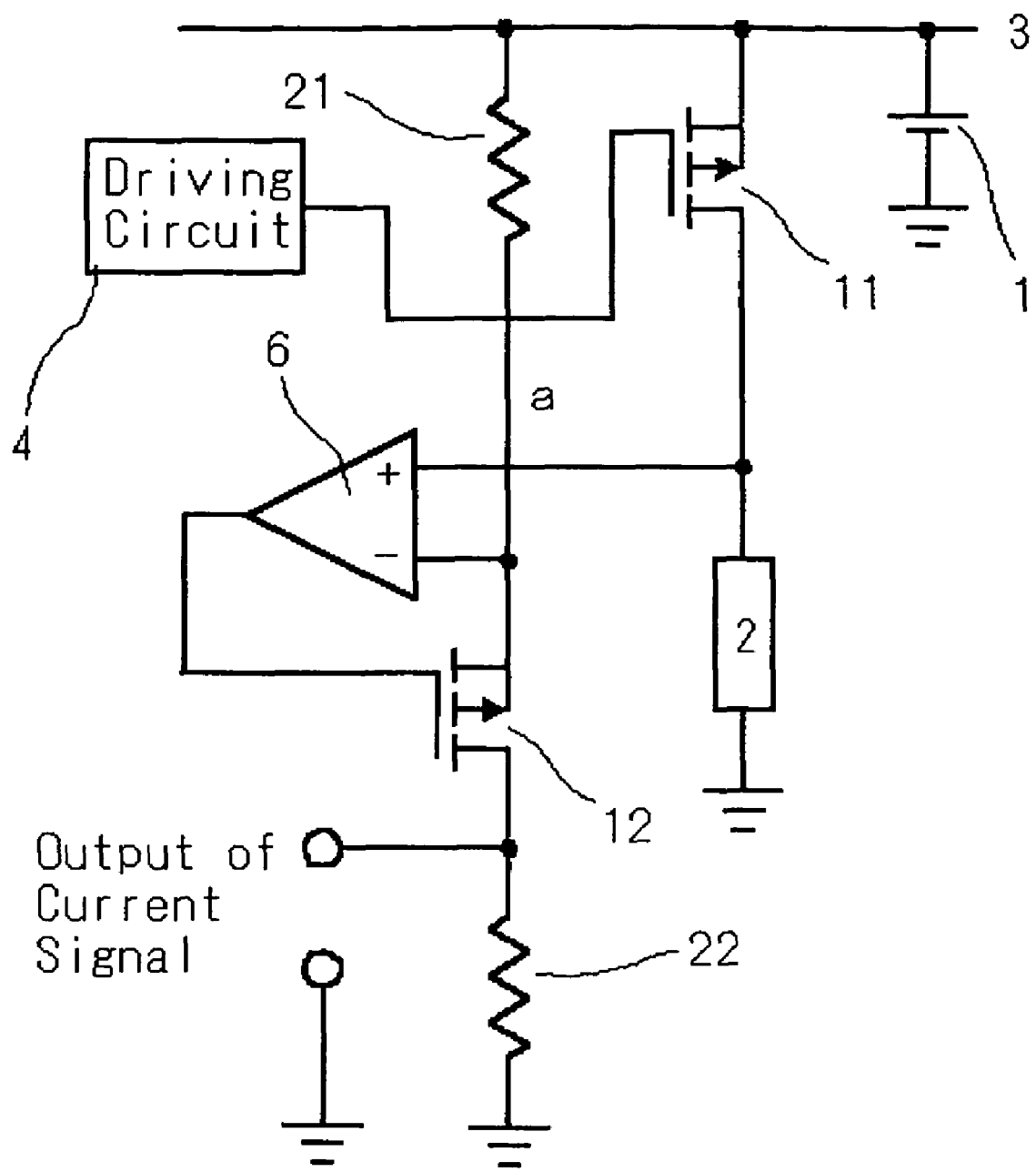
FIG. 1 is a circuit diagram showing outline of a first embodiment of a switching circuit according to the present invention.

The first embodiment of the switching circuit according to the present invention is shown in FIG. 1. 1 is an input power source, 2 is a load, 3 is fixed potential, 4 is a driving circuit, 6 is an amplifier, 11 is a main switch, 12 is a subsidiary switch, 13 is a third switch, 14 is a current detecting switch, 15 is a high side switch, 21 is a first resistance element, and 22 is a second resistance element.

The switching circuit according to the present embodiment comprises a main switch 11 composed of p-channel MOSFET, whose on-voltage shows resistance characteristics wherein a gate terminal of the main switch 11 is connected to a driving circuit 4. And a source terminal of the main switch is connected to the fixed potential 3 and a drain terminal thereof is connected to the load circuit 2. In addition, the fixed potential 3 may be connected to the drain terminal of the main switch 11 and the load circuit 2 may be connected to the source terminal of the main switch 11. This switching circuit comprises the current detecting circuit, which comprises the first resistance element 21 having higher resistance value (10000 times for example) than on-resistance of the main switch 11, and the first resistance element 21 is connected to the fixed potential 3 or the load circuit 2. Moreover, the first resistance element 21 may be an ordinary diffusion resistance or a poly-silicon resistance. And by setting temperature coefficient of the first resistance element 21 to the same value as that of the on-resistance of the main switch 11, an accurate current detecting circuit can be constructed. And the switching circuit comprising this current detecting circuit can be set up so as to shift a detecting point of over current to a lower current side according to elevation of temperature.

The current detecting circuit comprises the subsidiary switch 12 composed of p-channel MOSFET, wherein the first resistance element 21 is connected to a source terminal thereof. And the current detecting circuit comprises the amplifier 6. The positive-terminal of the amplifier 6 is connected to the drain terminal of the main switch 11, and a negative-terminal thereof is connected to the source terminal of the subsidiary switch and the first resistance element 21, and an output thereof is connected to a gate terminal of the subsidiary switch 12. The above-described constructions aims to output to the gate terminal of the subsidiary switch 12 by amplifying comparatively voltage generated at the first resistance element 21 and on-voltage of the main switch 11. And further the current detecting circuit comprises the second resistance element 22 that is connected to the drain terminal of the subsidiary switch 12 and is constructed so as to generate voltage by amplifying on-current of the main switch 11.

The switching circuit with the current detecting circuit is constructed as described above and operated as describing thereafter. When the main switch 11 is turned on, the main switch 11 generates on-voltage, which is detected by the amplifier 6. And by turning on the main switch 11, voltage is generated in the first resistance element 21 that is connected to the fixed potential 3 and detected by the amplifier 6. On-voltage detected by the amplifier 6 and voltage generated in the first resistance element 21 is amplified comparatively so as to generate and output voltage to the gate terminal of the subsidiary switch 12. That is, since potential difference of the input terminal of the amplifier 6 is about zero volt when on-current is detected, the current detecting circuit composed of the two resistance elements 21, 22, the subsidiary switch element 12 and the amplifier 6 can easily obtain high gain and amplify up to a high speed signal and supply a current signal of on-current of the main switch 11 with low impedance output.

Embodiment 2

Figure 2:
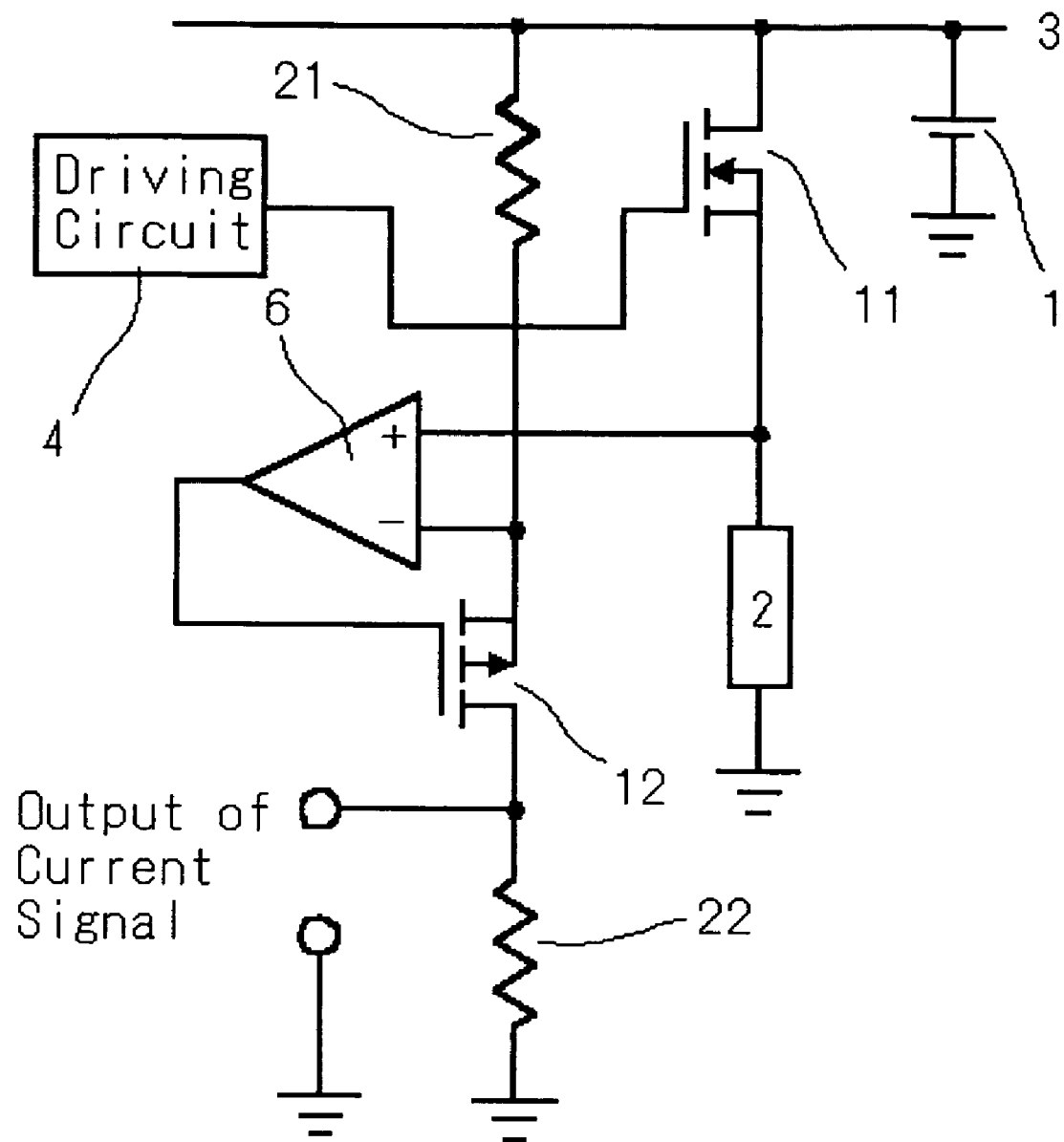
FIG. 2 is a circuit diagram showing outline of a second embodiment thereof.

The second embodiment is shown in FIG. 2. This embodiment is almost the same as that of the first embodiment. This embodiment is characterized in that the main switch 11 is composed of n-channel MOSFET. Detection of current can be also conducted by the same way as that of the first embodiment. However, polarity characteristics of output voltage of the driving circuit 4 is different from that of the first embodiment, that is, in the first embodiment, the main switch 11 becomes conductive by negative gate potential to the source potential, on the other hand, the main switch 11 becomes conductive by positive gate potential to the source potential in the case of this embodiment.

Embodiment 3

Figure 3:
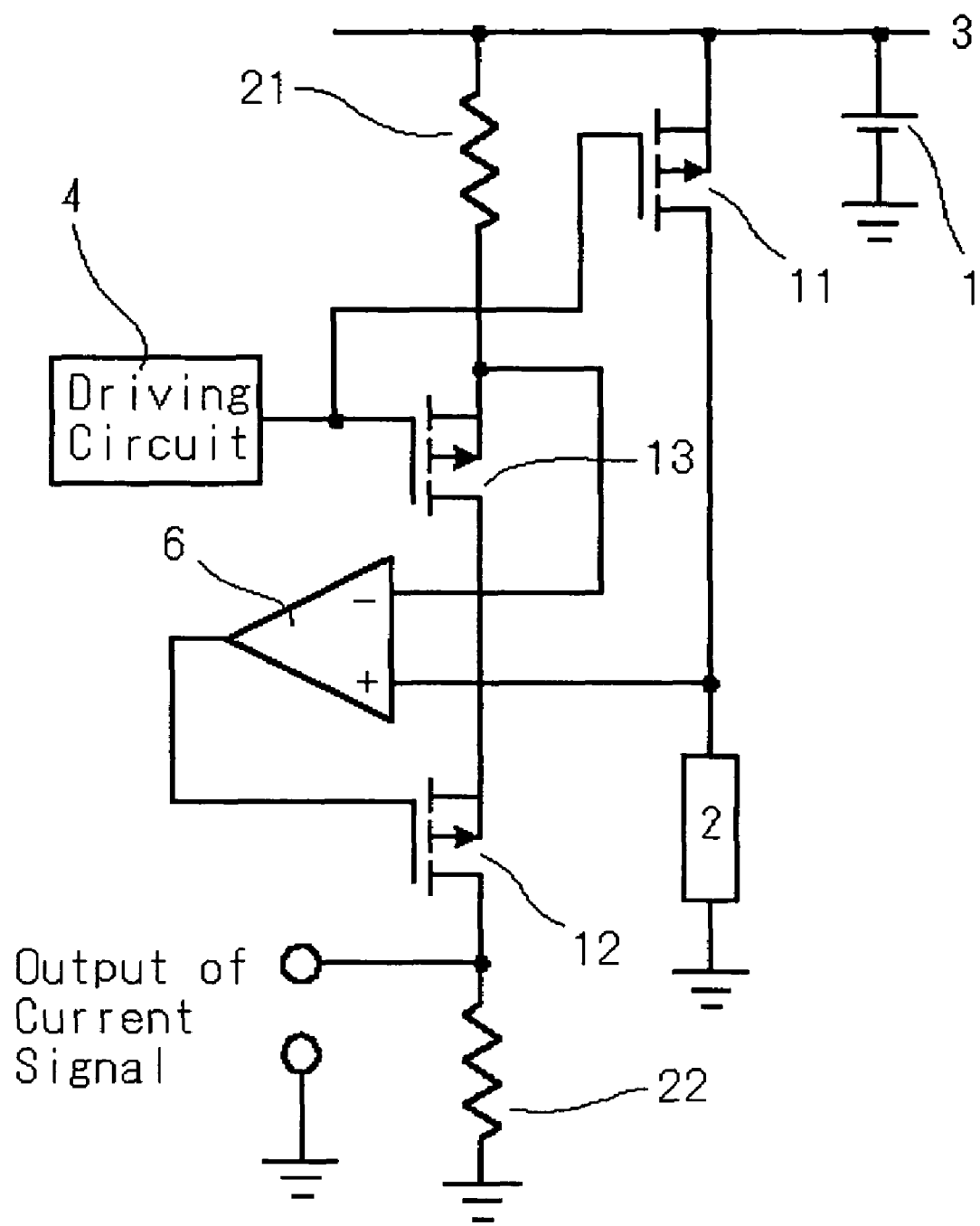
FIG. 3 is a circuit diagram showing outline of a third embodiment thereof.

The third embodiment is shown in FIG. 3. In this embodiment, the first resistance element 21 is connected to a source terminal of the third switch 13, wherein a drain terminal is connected to the source terminal of the subsidiary switch 12. And the gate terminal of the third switch 13 is connected to the driving circuit 4 and the gate signal of the third switch 13 is so constructed as to synchronize with that of the gate signal of the main switch 11. That is, since the main switch 11 is p-channel MOSFET in this embodiment, the third switch 13 is also p-channel MOSFET.

Because in the case of the third embodiment, the gate signal of the main switch 11 is so constructed as to synchronize with that of the gate signal of the third switch 13, when the main switch 11 is on off-state, and the third switch 13 is also on off-state, it is possible to prevent large current from flowing through the first resistance element 21. Therefore, a current detecting circuit with electric power of a low consumption is realized. And further operation waveform in this third embodiment is shown in the next FIG. 4.

Figure 4:
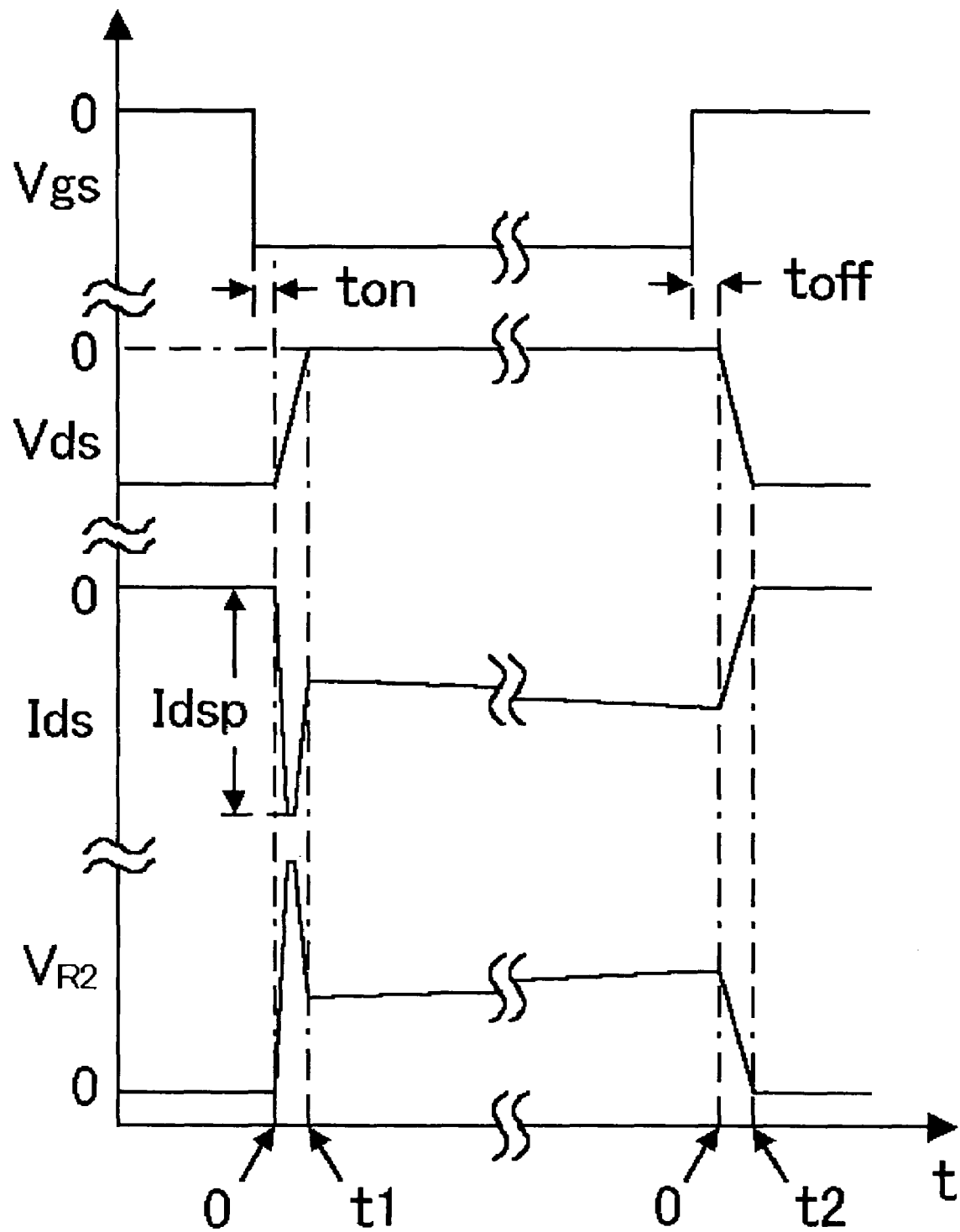
FIG. 4 is a diagram of operation waveform of the third embodiment shown in FIG. 3.

FIG. 4 shows, from the top, voltage Vgs between the gate and the source of the main switch 11, voltage Vds between the drain and the source of the main switch 11, current Ids between the drain and the source of the main switch 11 and current signal output generated in the second resistance element 22. In the case of the third embodiment, since the main switch 11 is p-channel MOSFET, Vgs, Vds and Ids functions by negative voltage and negative current. It is assumed as the case of components of parasitic capacity contained in load that a peak current Idsp is generated at the time of turn-on of the main switch 11. Voltage of the second resistance element 22 is similar to inversed pole of current of the main switch 11. And in FIG. 3, ton, and toff represents delay time of at the time of turn-on, turn-off respectively, and t1, and t2 represents drop time and rising edge time, respectively.

And further, the main switch may be n-channel MOSFET also in this embodiment. But since the gate signal of the third switch 13 is so constructed as to synchronize with that of the main switch 11, the third switch 13 is constructed by n-channel MOSFET in many instances. In this case, when pole characteristics of output voltage of the driving circuit 4 is positive potential to the source potential, the main switch 11 is operated.

Embodiment 4

Figure 5:
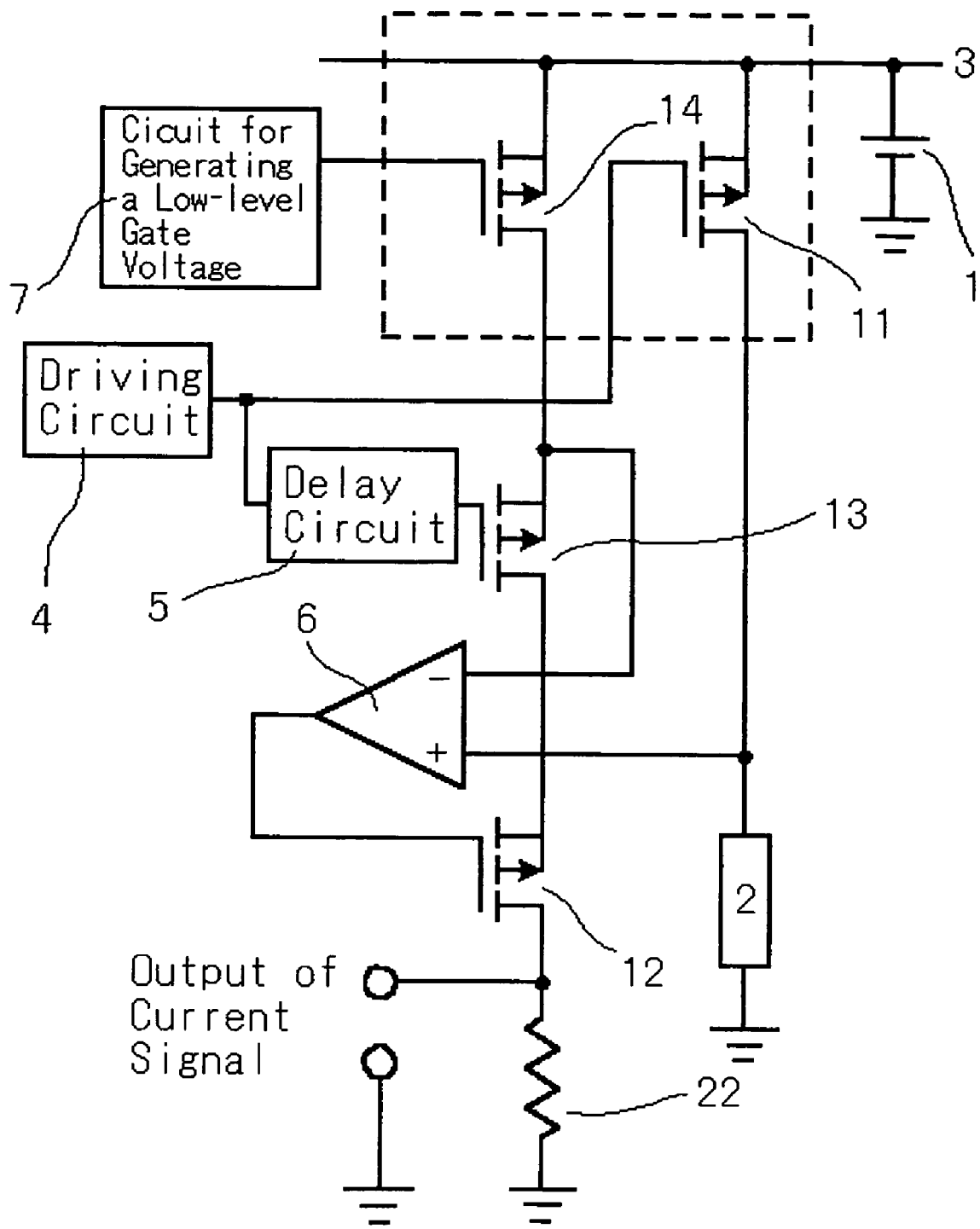
FIG. 5 is a circuit diagram showing outline of a fourth embodiment thereof.

The fourth embodiment is shown in FIG. 5. In this embodiment, in addition to the structure of the third embodiment, a delay circuit 5 is connected between the gate terminal of the third switch 13 and the driving circuit 4. And in this embodiment, the first resistance element has the same cell structure as the main switch 11 and uses the current detecting switch 14 constructed by MOSFET biased by a fixed gate. And further this current detecting switch 14 has higher on-resistance value (10000 times for example) than on-resistance of the main switch 11. The gate terminal of the current detecting switch 14 is connected to the circuit 7 for generating a low-level gate voltage.

In this embodiment, by connecting the delay circuit 5 between the gate terminal of the third switch and the driving circuit 4, when the main switch 11 of high-side is turned on, it is possible to prevent parasitic component of capacity charging current Idsp in the load circuit 2 from appearing as a detecting signal and it is also possible to prevent malfunction of an over current protecting circuit. And in this case, a delay time is usually about t1. Therefore, the delay circuit 5 causes the delay time by about t1, only when the third switch 13 is turned on, and the delay time is zero, when the third switch 13 is turned off.

And since the first resistance element has the same cell structure as that of the main switch 11 and has a higher resistance value than that of on-resistance of the main switch 11, and the current detecting switch 14 biased by the fixed gate is used, the on-resistance of this current detecting switch 14 has the same temperature characteristics and variation as these of the main switch 11, so that accuracy of detecting current can be easily improved. Therefore a current detecting circuit with a high reliability can be easily realized.

Embodiment 5

Figure 6:
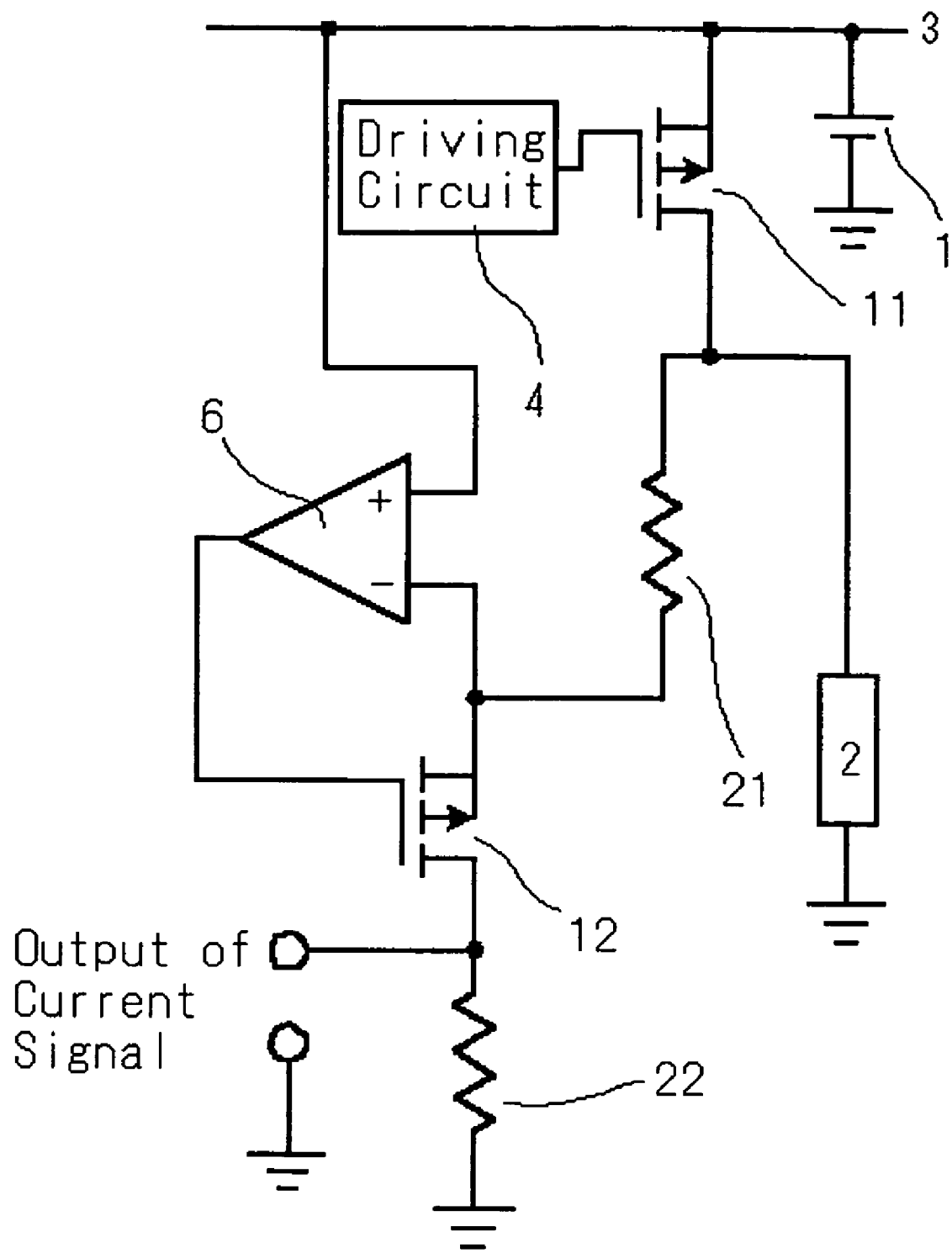
FIG. 6 is a circuit diagram showing outline of a fifth embodiment thereof.

The fifth embodiment is shown in FIG. 6. This embodiment shows a current detecting circuit of reversed direction current. In the current detecting circuit shown in the first to the fourth embodiments it is assumed that current, flowing in the direction from the power 3 through the main switch 11 to the load circuit 2, is positive. In the fifth embodiment, a current detecting circuit is provided, wherein current, flowing in the direction from the load circuit 2 through the main switch 11 to the input power 1, is positive. The amplifier 6 makes the subsidiary switch 12 operate, only when a positive potential is impressed between the source and drain of the main switch 11. At that time, an inversed current waveform of the main switch 11 is generated in the second resistance element 22, and the inversed current can be detected by using voltage waveform of the second resistance element 22.

Embodiment 6

Figure 7:
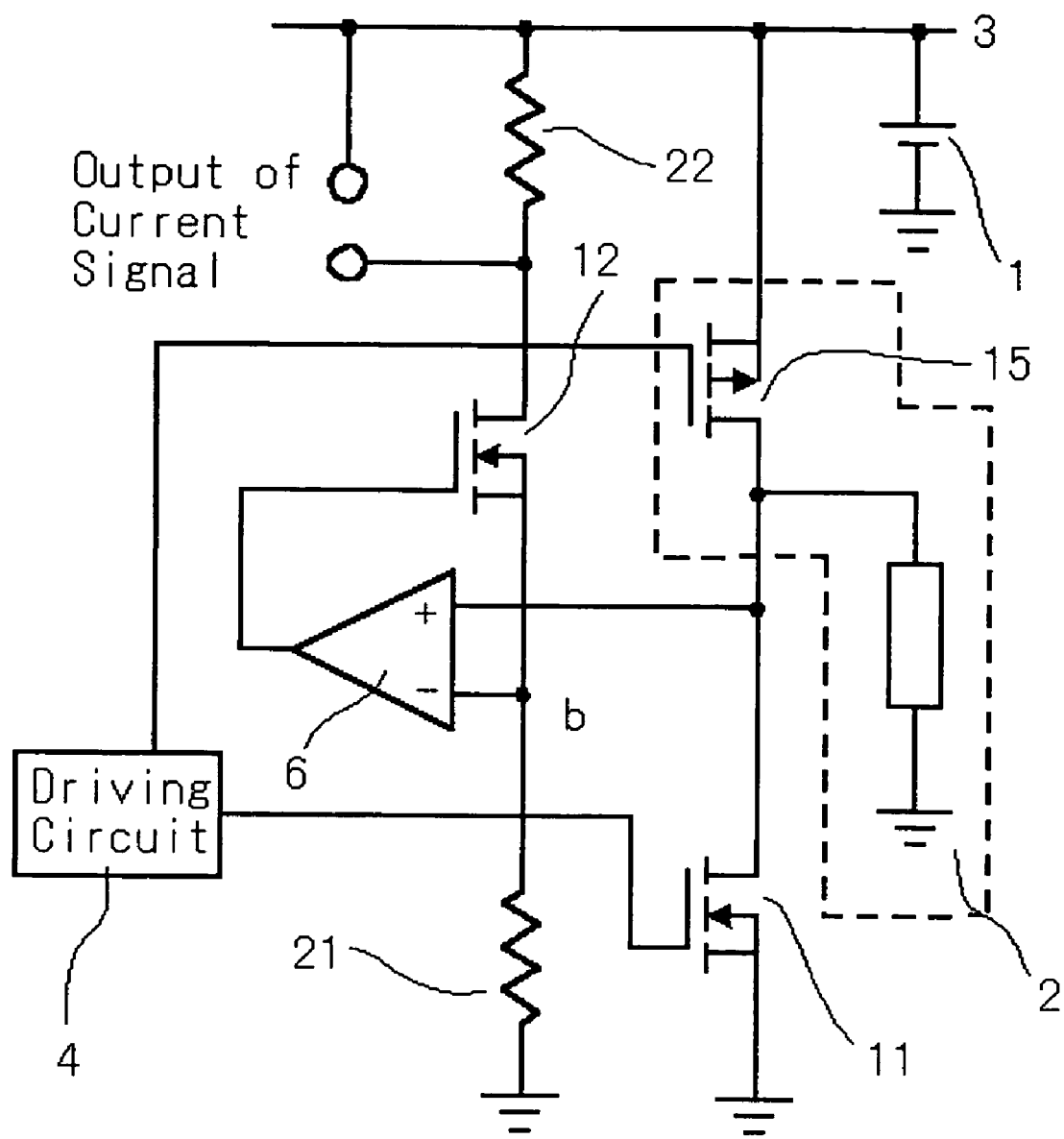
FIG. 7 is a circuit diagram showing outline of a sixth embodiment thereof.

The sixth embodiment is shown in FIG. 7. In the fifth embodiment, the fixed potential 3 is a negative pole of input voltage. This switching circuit comprises the main switch 11 composed of n-channel MOSFET, whose on-voltage shows resistance characteristics, wherein the gate terminal the main switch 11 is connected to the driving circuit 4. And the source terminal of the main switch 11 is earthed and the drain terminal thereof is connected to the load circuit 2. In addition, in the case that the main switch 11 is p-channel MOSFET, the drain terminal of the main switch 11 may be grounded and the load circuit 2 may be connected to the source terminal of the main switch 11. This switching circuit comprises the current detecting circuit, which comprises the first resistance element 21 having higher resistance value (10000 times for example) than that of on-resistance of the main switch 11, and the first resistance element 21 is grounded. Further, the first resistance element 21 may be a conventional diffusion resistance or preferably a poly-silicon resistance. And by setting temperature coefficient of the first resistance element 21 the same as that of on-resistance of the main switch 11, an accurate current detecting circuit can be constructed. And the switching circuit using this current detecting circuit can be set up so as to shift a detecting point of over current to a lower current side according to elevation of temperature.

The current detecting circuit comprises the subsidiary switch 12 composed of n-channel MOSFET, wherein the first resistance element 21 is connected to the source terminal thereof. And the current detecting circuit comprises the amplifier 6. A positive-terminal of the amplifier 6 is connected to the drain terminal of the main switch 11, a negative-terminal thereof is connected to the source terminal of the subsidiary switch 12 and the first resistance element 21, wherein an output is connected to the gate terminal of the subsidiary switch 12. As above described, the voltage generated in the first resistance element and on-voltage of the main switch 11 is comparatively amplified so as to output it to the gate terminal of the subsidiary switch 12. Further the current detecting circuit comprises the second resistance element 22 that is connected to the drain terminal of the subsidiary switch 12 and constructed so as to generate voltage by amplifying on-current of the main switch 11.

And the load circuit of this embodiment comprises a high side switch 15 composed of p-channel MOSFET. A drain terminal of the high side switch 15 is connected to the drain terminal of the main switch 11, the positive-terminal of the amplifier 6 and its load, wherein a source terminal thereof is connected to the fixed potential 3. And a gate terminal thereof is connected to the driving circuit 4 and a CMOS inverter is made up with the main switch 11 and the high side switch 15. The switching circuit with the current detecting circuit is constructed as above-described and its fundamental operation principle is about the same as that of the first embodiment but only polarity is inverted.

Embodiment 7

Figure 8:
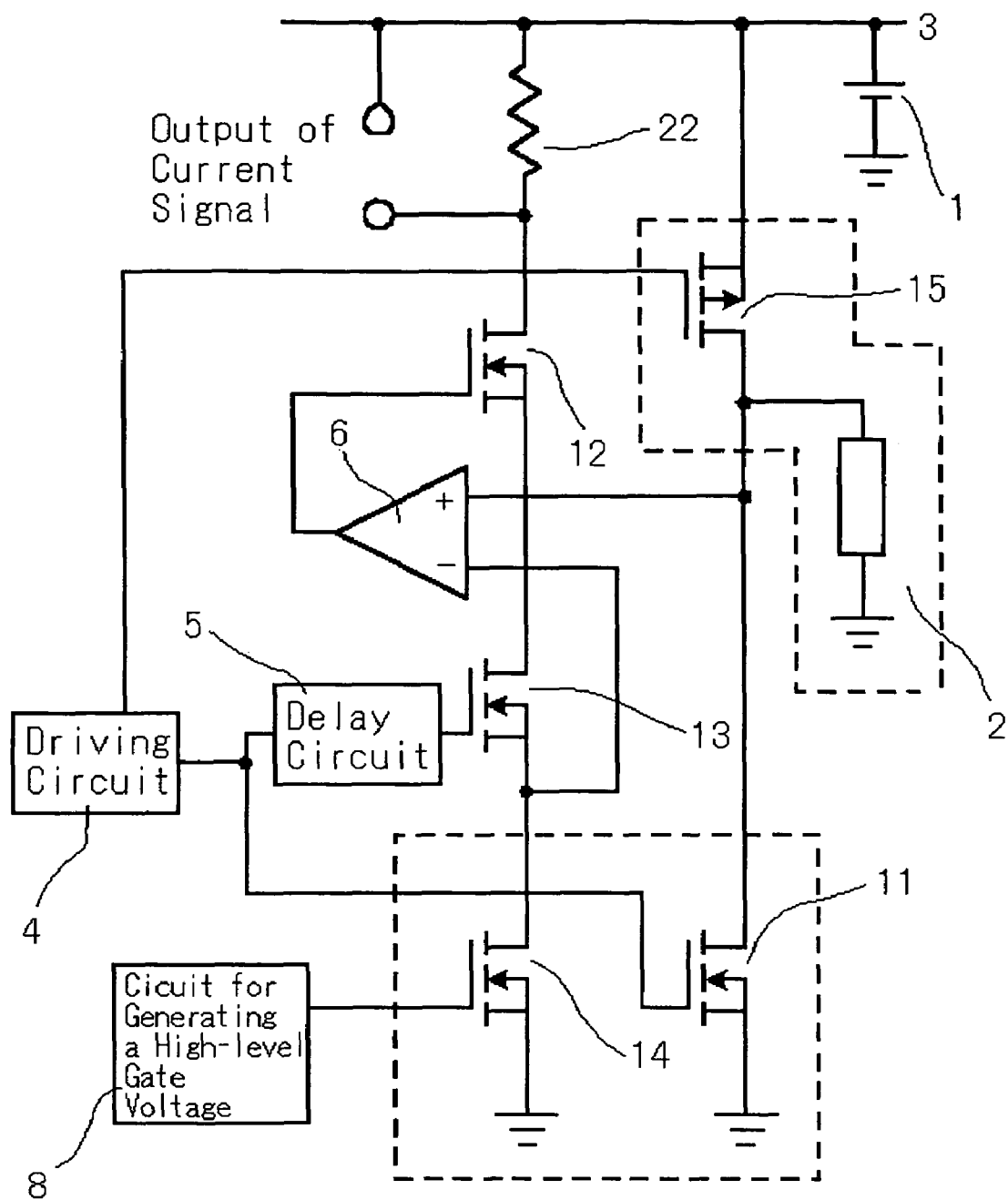
FIG. 8 is a circuit diagram showing outline of a seventh embodiment thereof.

The seventh embodiment is shown in FIG. 8. This embodiment is an example in the case that a fixed potential 3 in the fourth embodiment is a negative terminal of input voltage. In this embodiment, the first resistance element is connected to the source terminal of a third switch 13, wherein the drain terminal of the third switch is connected to the source terminal of the subsidiary switch. And in this embodiment, the first resistance element has the same cell structure as that of the main switch 11 and uses the current detecting switch 14 constructed by MOSFET biased by a fixed gate. And further this MOSFET has higher on-resistance value (10000 times for example) than on-resistance of the main switch 11.

The gate terminal of the third switch 13 is connected to the driving circuit 4 and the gate signal of the third switch 13 is so constructed as to synchronize that of the main switch 11. That is, in this embodiment, the main switch 11 is n-channel MOSFET so that the third switch 13 is also n-channel MOSFET. In this embodiment, a delay circuit 5 is connected between the gate terminal of the third switch 13 and the driving circuit 4. The gate terminal of this current detecting switch 14 is connected to the circuit 8 for generating a high-level gate voltage.

In this seventh embodiment, the gate signal of the main switch 11 and the gate signal of the third switch 13 are constructed so as to synchronize each other so that when the main switch 11 is in off-state, the third switch is also in off-state, and therefore when the main switch 11 is in off-state, over current can be prevented from flowing in the current detecting switch 14. That can realize a current detecting circuit with low power consumption. And since the delay circuit 5 is connected between the gate terminal of the third switch 13 and the driving circuit 4, delay is caused only at turn-on, so that when the main switch 11 of low-side is turned on, generation of parasitic component of capacity charging current Idsp in the load circuit 2 as signal waveform can be prevented and malfunction of an over current protecting circuit can be prevented.

Further the first resistance element has the same cell structure as that of the main switch 11 and has a higher on-resistance value than that of on-resistance of the main switch 11 and the current detecting switch 14 biased by the fixed gate is used, so that, the on-resistance of this current detecting switch 14 has the same temperature characteristics and variation as these of the main switch 13, so that accuracy of current detection can be easily improved. Therefore a current detecting circuit with a high reliability can be easily realized same as in case of the fourth embodiment.

Embodiment 8

Figure 9:
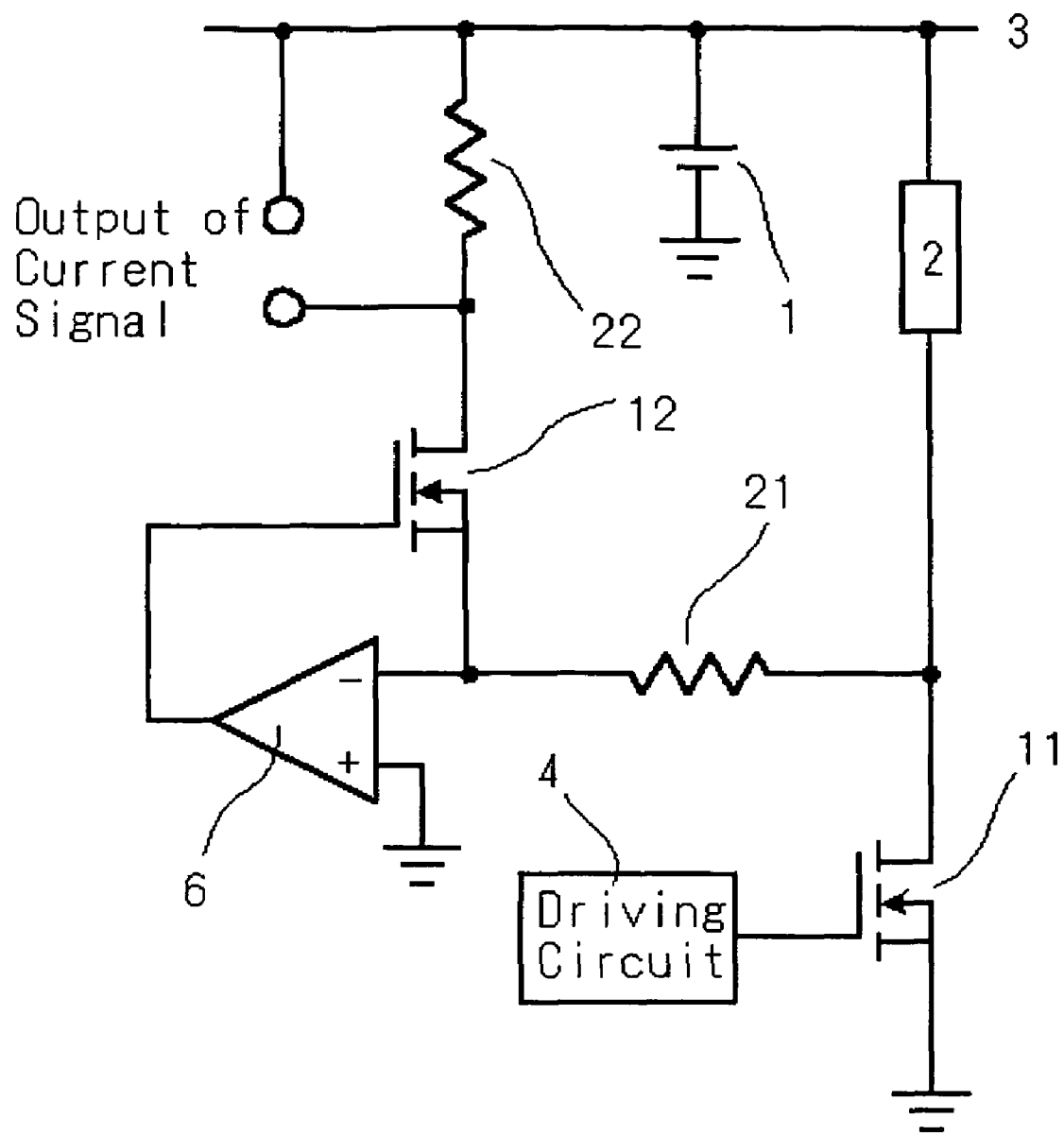
FIG. 9 is a circuit diagram showing outline of an eighth embodiment thereof.
Figure 10:
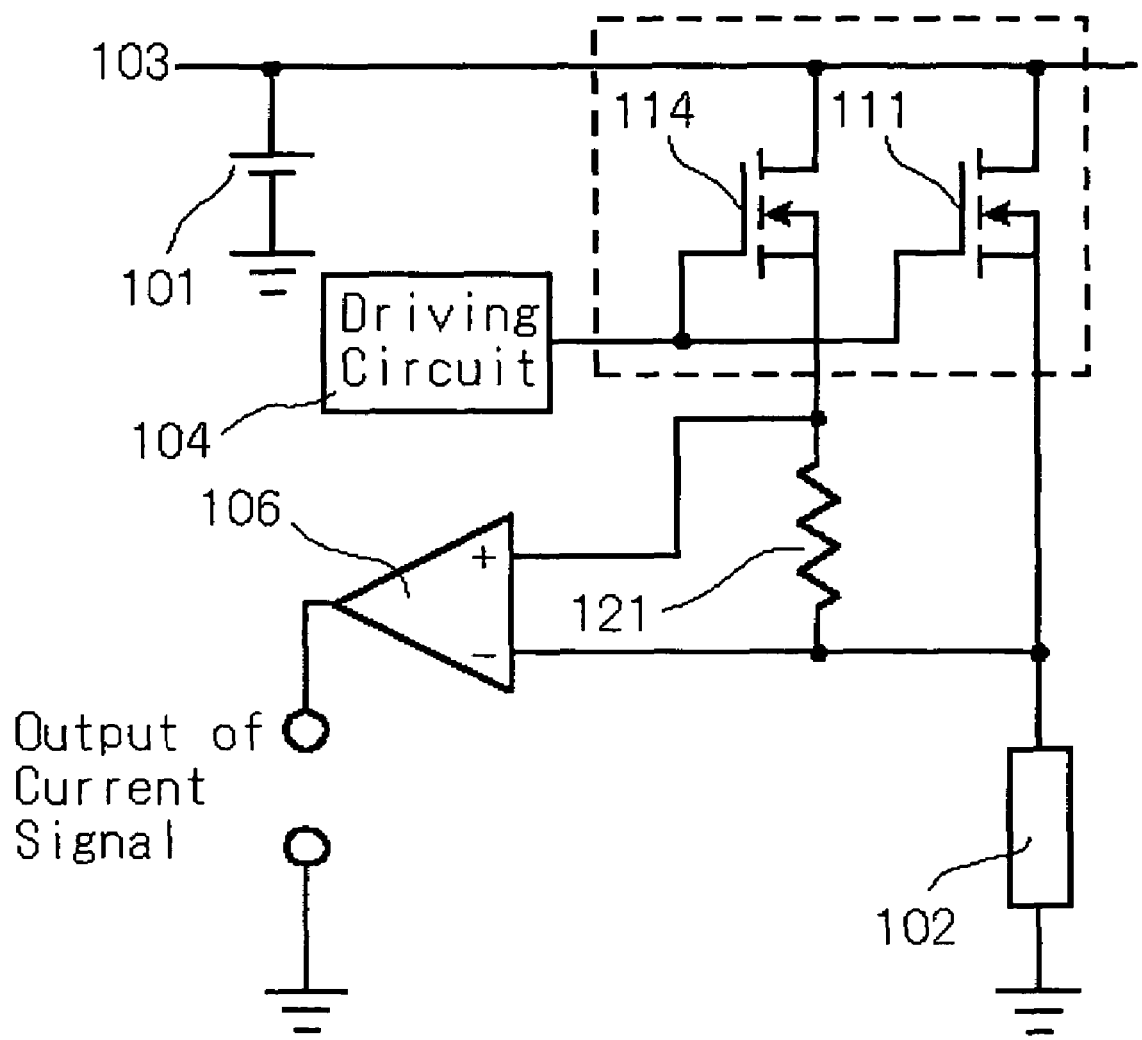
FIG. 10 is a circuit diagram showing outline of a first conventional example of a switching circuit.
Figure 11:
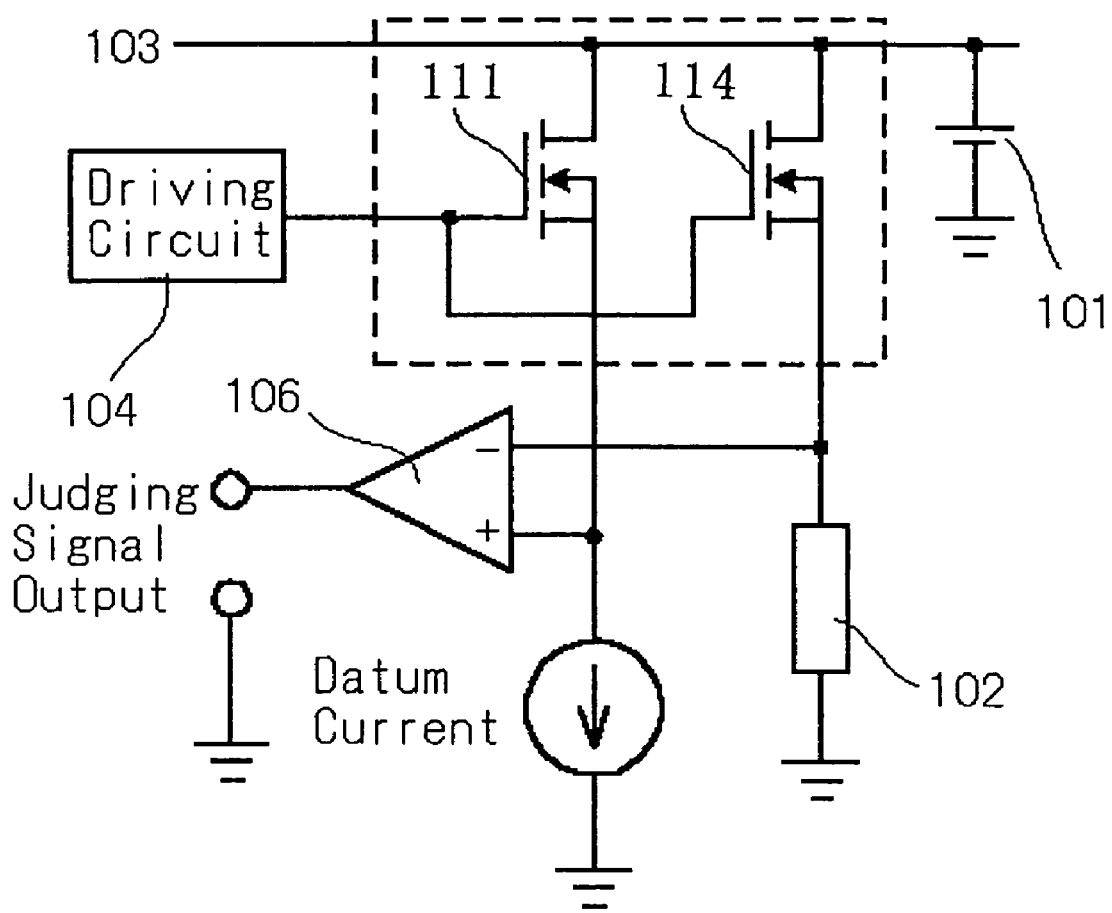
FIG. 11 is a circuit diagram showing outline of a second conventional example.

The eighth embodiment is shown in FIG. 9. In this embodiment, a current detecting circuit with a inversed flow direction is provided, wherein it is applied in the case that the fixed potential 3 in the fifth embodiment is negative terminal of input voltage. In the current detecting circuit shown in the sixth embodiment and the seventh embodiment, it is assumed that current, flowing in the direction from the load circuit 2 through the main switch 11 to the negative terminal of input voltage, is positive. FIG. 9 shows a current detecting circuit wherein current, flowing in the direction from the negative terminal of input voltage through the main switch 11 to the load circuit 2, is positive. The amplifier 6 functions the subsidiary switch 12, only when a negative voltage is charged between source and drain of the main switch 11. At that time, an inversed current waveform of the main switch 11 is generated in the second resistance element 22 and an inversed current can be detected by using a voltage waveform of the second resistance element 22.

INDUSTRIAL APPLICABILITY

The present invention provides the effect that a current detecting circuit, which can output large current waveform while keeping difference of input voltage of an amplifier about zero volt, can be obtained and further provides the effect that by connecting the third switch, of which gate signal synchronizes that of a main switch, between the first resistance element and the subsidiary switch, voltage waveform of the second resistance element become similar to that of current wave of the main switch and that the current waveform can be thereby treated with high speed in shape of large voltage signal.

By means that the first resistance element made of poly-silicon resistance is formed on insulating film, insulation between the main switch and the first resistance element can be formed easily and a highly integrated circuit may be possible and parasitic capacity etc. become so small that high speed operation become possible. By means that the first resistance element is so formed that its temperature coefficient has higher positive value than that of the main switch, the current detecting circuit using the first resistance element can provide easily a switching circuit with stronger function of anti-heat-bursting. Therefore, a current detecting circuit with many excellent features can be easily formed. Therefore the present invention provides an effect that a current detecting circuit with many excellent features can be easily formed.

What is claimed is:

1. A switching circuit having a switching element, comprising: a current detecting circuit having a main switch composed of MOSFET having an on-resistance at on-voltage, wherein a gate terminal thereof is connected to a driving circuit, and further one of a drain terminal and a source terminal thereof is connected to a fixed potential and the other terminal is connected to a load circuit; a first resistance element having higher resistance value than the on-resistance of the main switch; a subsidiary switch composed of MOSFET, the source terminal of which is connected to the first resistance element, an amplifier that amplifies comparatively a first resistance element voltage generated in the first resistance element and the on-voltage of the main switch and generates an output to a subsidiary switch gate terminal of the subsidiary switch; a second resistance element connected to a drain terminal of the subsidiary switch, in which a second resistance element voltage is generated according to an on-current of the main switch; and a third switch, connected between the first resistance element and the subsidiary switch in which a third switch gate terminal of the third switch is connected to the driving circuit so that a gate signal of the third switch is synchronized with that of the main switch.

2. The switching circuit according to claim 1, wherein one of terminals of the first resistance element is further connected to the fixed potential as in the main switch.

3. The switching circuit according to claim 1, wherein one of terminals of the first resistance element is connected to a terminal which is connected to the load circuit of the main switch, and the other terminal of the first resistance element is connected to the source terminal of the subsidiary switch.

4. The switching circuit according to claim 1, wherein the first resistance element has the same cell structure as the main switch and is MOSFET biased by a fixed gate or poly-silicon resistance.

5. The switching circuit according to claim 1, wherein the first resistance element has the same cell structure as the main switch and is MOSFET biased by a fixed gate or poly-silicon resistance, wherein one of terminals of the first resistance element is connected to the fixed potential as in the main switch.

6. The switching circuit according to claim 1, the first resistance element has the same cell structure as the main switch and is MOSFET biased by a fixed gate or poly-silicon resistance wherein one of terminals of this first resistance element is connected to a terminal which is connected to the load circuit of the main switch and the other terminal of the first resistance element is connected to the source terminal of the subsidiary switch.

* * * * *